(12) United States Patent
Katsumata et al.

(10) Patent No.: US 9,717,161 B2
(45) Date of Patent: Jul. 25, 2017

(54) BOARD ASSEMBLY INCLUDING COOLING SYSTEM AND ELECTRONIC APPARATUS

(71) Applicant: FUJITSU LIMITED, Kawasaki-shi, Kanagawa (JP)

(72) Inventors: Kenji Katsumata, Odawara (JP); Jie Wei, Hachioji (JP); Masumi Suzuki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/872,728

(22) Filed: Oct. 1, 2015

(65) Prior Publication Data
US 2016/0183407 A1    Jun. 23, 2016

(30) Foreign Application Priority Data

Dec. 19, 2014   (JP) ................. 2014-256843

(51) Int. Cl.
*H05K 7/20*   (2006.01)
*H05K 1/02*   (2006.01)
(Continued)

(52) U.S. Cl.
CPC ....... *H05K 7/20254* (2013.01); *H05K 1/0203* (2013.01); *H05K 1/181* (2013.01); *H05K 7/20772* (2013.01); *H01L 23/473* (2013.01)

(58) Field of Classification Search
CPC ........... H05K 7/20218; H05K 7/20254; H05K 7/20509; H05K 7/20263; H05K 7/20627; H05K 7/20636; H05K 7/20763; H05K 7/20872; H05K 7/20981; H05K 2201/064; H01L 23/34; H01L 23/46; H01L 23/473
(Continued)

(56) References Cited

U.S. PATENT DOCUMENTS

| | | | | |
|---|---|---|---|---|
| 4,183,042 A | * | 1/1980 | Novak | ........... H01L 23/051 |
| | | | | 257/689 |
| 4,882,654 A | * | 11/1989 | Nelson | ........... H01L 23/433 |
| | | | | 257/E23.09 |

(Continued)

FOREIGN PATENT DOCUMENTS

| | | |
|---|---|---|
| JP | 11-163565 A | 6/1999 |
| JP | 2006-019595 A | 1/2006 |

*Primary Examiner* — Zachary M Pape
*Assistant Examiner* — Amir Jalali
(74) *Attorney, Agent, or Firm* — Squire Patton Boggs (US) LLP

(57) ABSTRACT

A board assembly including a cooling system includes: a wiring board; a first heat generating component mounted on a surface of the wiring board; a first heat receiving portion mounted on the first heat generating component and configured to allow a coolant to pass therethrough; a second heat generating component mounted on another surface of the wiring board; a second heat receiving portion mounted on the second heat generating component and configured to allow the coolant to pass therethrough; and a support post disposed through the wiring board so as to extend between the first heat receiving portion and the second heat receiving portion, the support post having a space through which the coolant flows from the first heat receiving portion to the second heat receiving portion or from the second heat receiving portion to the first heat receiving portion.

9 Claims, 11 Drawing Sheets

(51) Int. Cl.
*H05K 1/18* (2006.01)
*H01L 23/473* (2006.01)

(58) Field of Classification Search
USPC ............. 361/699, 701–702, 718–719, 689;
165/80.4–80.5, 104.3; 174/15.1–15.2,
174/252; 257/714
See application file for complete search history.

(56) References Cited

U.S. PATENT DOCUMENTS

| | | | | |
|---|---|---|---|---|
| 5,050,037 | A * | 9/1991 | Yamamoto | H01L 23/4332 165/80.4 |
| 5,132,777 | A * | 7/1992 | Kloucek | H01L 23/3677 257/714 |
| 5,713,690 | A * | 2/1998 | Corbin, Jr. | H01L 23/4006 174/16.3 |
| 5,815,370 | A * | 9/1998 | Sutton | H05K 7/20281 165/80.4 |
| 5,993,750 | A * | 11/1999 | Ghosh | B01F 5/0604 165/185 |
| 6,016,251 | A | 1/2000 | Koide et al. | |
| 6,366,462 | B1 * | 4/2002 | Chu | H01L 23/427 165/80.4 |
| 6,490,159 | B1 * | 12/2002 | Goenka | H05K 1/0272 165/80.4 |
| 7,028,761 | B2 * | 4/2006 | Lee | F28F 3/12 165/104.33 |
| 7,656,016 | B2 * | 2/2010 | Yoshimatsu | H01L 25/112 165/80.4 |
| 8,061,412 | B2 * | 11/2011 | Ippoushi | H01L 23/473 165/185 |
| 8,829,670 | B1 * | 9/2014 | Zhang | H01L 23/473 257/713 |
| 8,991,478 | B2 * | 3/2015 | Zaffetti | H01L 23/473 165/144 |
| 9,480,191 | B2 * | 10/2016 | Yui | H05K 9/0022 |
| 2001/0020365 | A1 * | 9/2001 | Kubo | F28D 15/0266 62/1 |
| 2003/0043563 | A1 * | 3/2003 | Igarashi | H05K 1/0218 361/800 |
| 2007/0091578 | A1 * | 4/2007 | Chang | H01L 23/3677 361/719 |
| 2007/0097627 | A1 * | 5/2007 | Taylor | H05K 7/20927 361/689 |
| 2008/0191236 | A1 * | 8/2008 | De Graaf | F28D 15/0233 257/99 |
| 2011/0272121 | A1 * | 11/2011 | Suzuki | H01L 23/473 165/104.19 |
| 2012/0267239 | A1 * | 10/2012 | Chen | H01L 23/473 204/242 |
| 2013/0148305 | A1 * | 6/2013 | Ankireddi | H01L 23/367 361/718 |
| 2014/0204532 | A1 * | 7/2014 | Mehring | H05K 7/20 361/689 |
| 2015/0062822 | A1 * | 3/2015 | Aoki | H01L 23/3675 361/702 |
| 2015/0351283 | A1 * | 12/2015 | Yamada | F28F 13/08 165/80.4 |

* cited by examiner

BOARD ASSEMBLY INCLUDING COOLING SYSTEM AND ELECTRONIC APPARATUS

CROSS-REFERENCE TO RELATED APPLICATION

This application is based upon and claims the benefit of priority of the prior Japanese Patent Application No. 2014-256843, filed on Dec. 19, 2014, the entire contents of which are incorporated herein by reference.

FIELD

The embodiment discussed herein is related to, for example, a board assembly including a cooling system, and an electronic apparatus provided with the board assembly including the cooling system.

BACKGROUND

Recently, electronic apparatuses such as a server and a supercomputer have been actively developed to achieve higher performance. Electronic components mounted in electronic apparatuses such as a central processing unit (CPU) generate heat during operation.

If the electronic components such as a CPU are overheated, deficiencies such as a breakdown, a malfunction, or deterioration in processing performance may occur. Thus, a cooler is provided to cool the electronic component that generates a large amount of heat.

Air cooling or liquid cooling is used to cool the electronic components. The liquid cooling is most likely to be employed to cool the electronic component that generates a large amount of heat. Such technique is described in Japanese Laid-open Patent Publication Nos. 2006-19595 and 11-163565. Hereinafter, the components that generate a large amount of heat are referred to as heat generating components.

In a cooling system of liquid cooling type, a heat receiving portion is mounted on the heat generating component and a heat dissipater such as a heat exchanger is disposed remote from the heat generating component. The heat receiving portion and the heat dissipater are connected by a pipe or a tube (hereinafter, simply referred to as a pipe). The heat receiving portion has a channel through which a coolant flows. Circulation of the coolant between the heat receiving portion and the heat dissipater allows the heat generated at the heat generating component to be transferred to the heat dissipater and to be dissipated into the atmosphere from the heat dissipater.

In this application, water or other liquids (refrigerant) for transferring the heat from the heat receiving portion to the heat dissipater is referred to as a coolant.

Wiring boards used in electronic apparatuses such as the servers and the supercomputers are likely to have the heat generating component on each surface thereof. In such a wiring board, the heat receiving portion is disposed on each surface of the heat generating component. Pipes are arranged to allow the coolant to sequentially pass the heat receiving portions or pipes are branched by branch joints to allow the coolant to pass in parallel through the heat receiving portions.

SUMMARY

In accordance with an aspect of the embodiments, a board assembly including a cooling system includes: a wiring board; a first heat generating component mounted on a surface of the wiring board; a first heat receiving portion mounted on the first heat generating component and configured to allow a coolant to pass therethrough; a second heat generating component mounted on another surface of the wiring board; a second heat receiving portion mounted on the second heat generating component and configured to allow the coolant to pass therethrough; and a support post disposed through the wiring board so as to extend between the first heat receiving portion and the second heat receiving portion, the support post having a space through which the coolant flows from the first heat receiving portion to the second heat receiving portion or from the second heat receiving portion to the first heat receiving portion.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

These and/or other aspects and advantages will become apparent and more readily appreciated from the following description of the embodiments, taken in conjunction with the accompanying drawing of which.

DESCRIPTION OF EMBODIMENT

Hereinafter, preliminary information is provided prior to description of the embodiment for ease of understanding of the embodiment.

Figure 1:
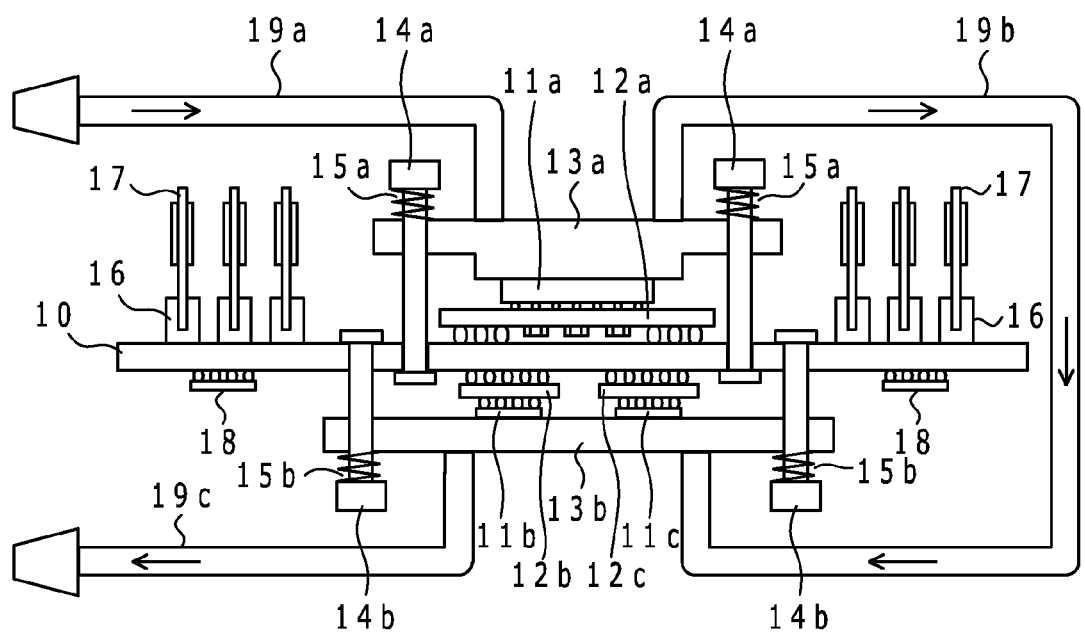
FIG. 1 is a schematic view illustrating an example of a cooling structure for a wiring board in which a heat generating component is mounted on each surface of the wiring board.

FIG. 1 is a schematic view illustrating an example of a cooling structure for a wiring board in which a heat generating component is mounted on each surface of the wiring board. An arrow in FIG. 1 indicates a flow direction of a coolant.

In the example illustrated in FIG. 1, a sub board (for example, an interposer) 12a on which a heat generating component 11a is mounted is disposed on a front surface (upper surface) of a wiring board 10. A heat receiving portion 13a is disposed on the heat generating component 11a with a heat conducting sheet (not illustrated) being disposed therebetween. The heat receiving portion 13a is secured to the wiring board 10 through support posts 14a and springs 15a and urged toward the wiring board 10. The heat receiving portion 13a has a flat surface at least at a position facing the heat generating component 11a. The heat receiving portion 13a has a channel for the coolant therein.

A plurality of sockets 16 is disposed on the front surface of the wiring board 10. Memory boards 17 are detachably attached to the sockets 16.

Heat generating components 11b and 11c that are mounted on sub boards 12b and 12c respectively are disposed on a rear surface (lower surface) of the wiring board 10. In the example illustrated in FIG. 1, electronic components 18 that generate small amounts of heat are disposed on the rear surface of the wiring board 10.

A heat receiving portion 13b is disposed below the heat generating components 11b and 11c and shared by the heat generating components 11b and 11c. The heat receiving portion 13b has a flat surface at least at a position facing the heat generating components 11b and 11c. The heat receiving portion 13b has a channel for coolant therein. A heat conducting sheet (not illustrated) is disposed between each of the heat generating components 11b and 11c and the heat receiving portion 13b.

The heat receiving portion 13b is secured to the wiring board 10 through support posts 14b and springs 15b and urged toward the wiring board 10.

A pipe 19a is connected to a coolant inlet of the heat receiving portion 13a at one end thereof and connected to a coolant supply port of a heat dissipater (not illustrated) at the other end thereof. The heat dissipater includes a heat exchanger and a fan, for example.

A coolant outlet of the heat receiving portion 13a and a coolant inlet of the heat receiving portion 13b are connected by a pipe 19b. A pipe 19c is connected to a coolant outlet of the heat receiving portion 13b at one end thereof and connected to a coolant return port of the heat dissipater at the other end thereof.

Figure 2:
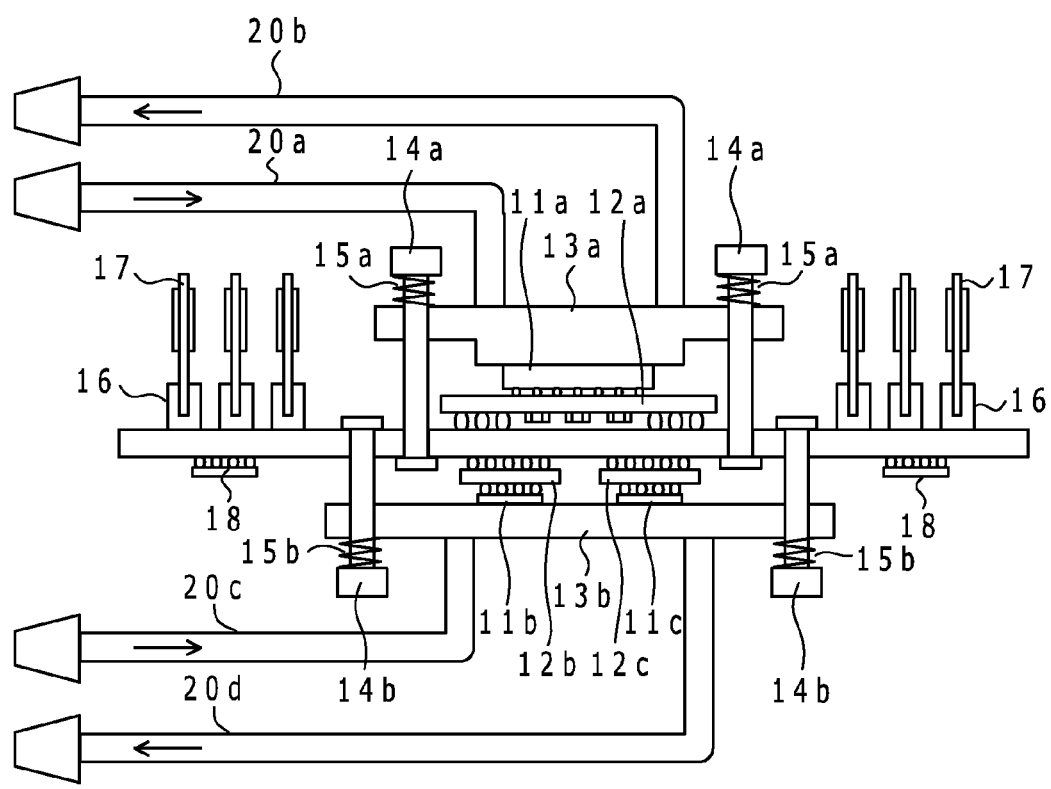
FIG. 2 is a schematic view illustrating another example of a cooling structure for a wiring board in which a heat generating component is mounted on each surface of the wiring board.

FIG. 2 is a schematic view illustrating another example of a cooling structure for a wiring board in which a heat generating component is mounted on each surface of a wiring board. In FIG. 2, components identical to those in FIG. 1 are assigned the same reference numerals as those in FIG. 1. An arrow in FIG. 2 indicates a flow direction of the coolant.

In the example illustrated in FIG. 2, pipes 20a and 20b are connected to the coolant inlet and the coolant outlet respectively of the heat receiving portion 13a. In addition, pipes 20c and 20d are connected to the coolant inlet and the coolant outlet respectively of the heat receiving portion 13b. The pipes 20a and 20c are connected to the coolant supply port of the heat dissipater through a first branch joint (not illustrated). The pipes 20b and 20d are connected to the coolant return port of the heat dissipater through a second branch joint (not illustrated).

In the cooling structures illustrated in FIG. 1 and FIG. 2, the heat dissipater and each of the heat receiving portions 13a and 13b are simply connected by the pipes. Thus, the total length of the pipes becomes longer as the number of pipes increases. This leads to an increase in the size of an assembly including the pipes and an increase in the size of the electronic apparatus. In addition, a weight of the assembly including the pipes becomes heavier, which makes it difficult to maintain the electronic apparatus.

The following embodiment describes a board assembly including a cooling system in which a pipe arrangement is simple to reduce a size and weight of the electronic apparatus.

Embodiment

Figure 3:
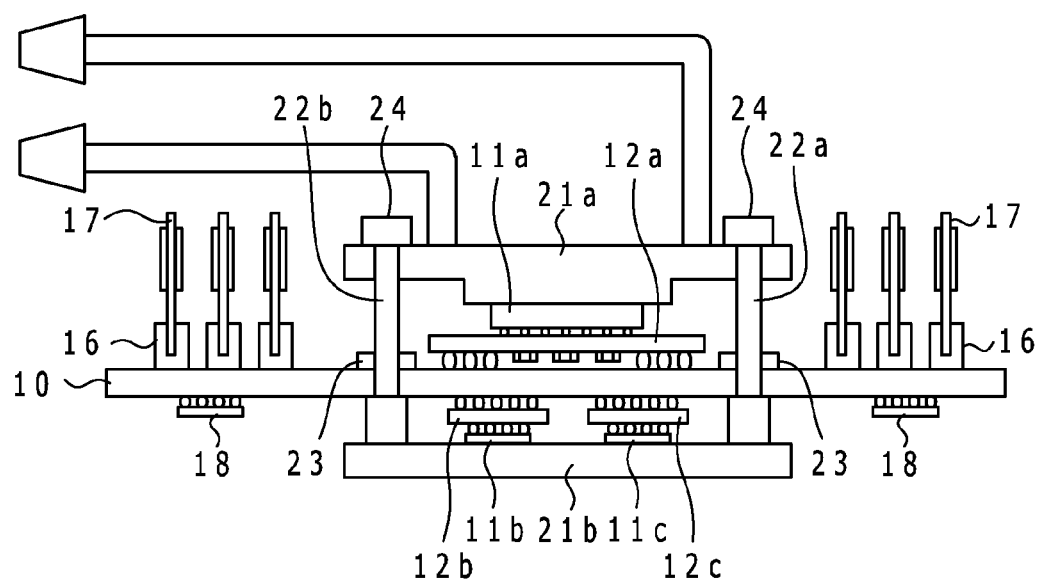
FIG. 3 is a schematic cross-sectional view illustrating a board assembly including a cooling system according to an embodiment.
Figure 4:
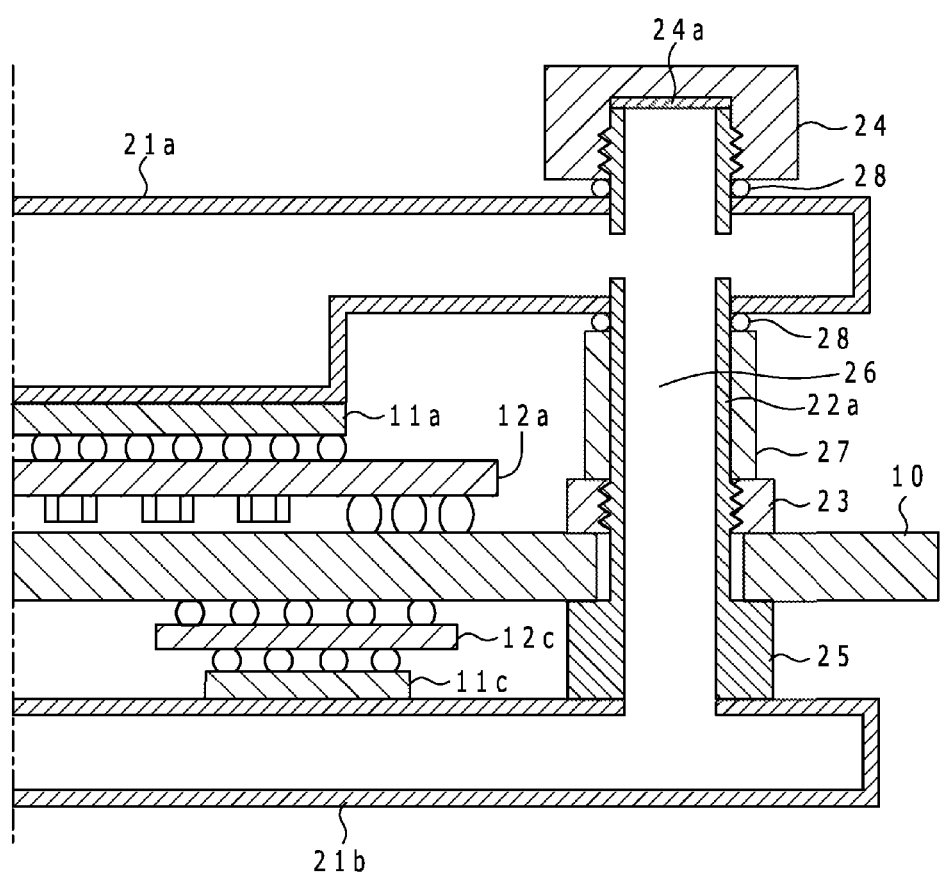
FIG. 4 is a partial schematic cross-sectional view illustrating the board assembly in FIG. 3.
Figure 5:
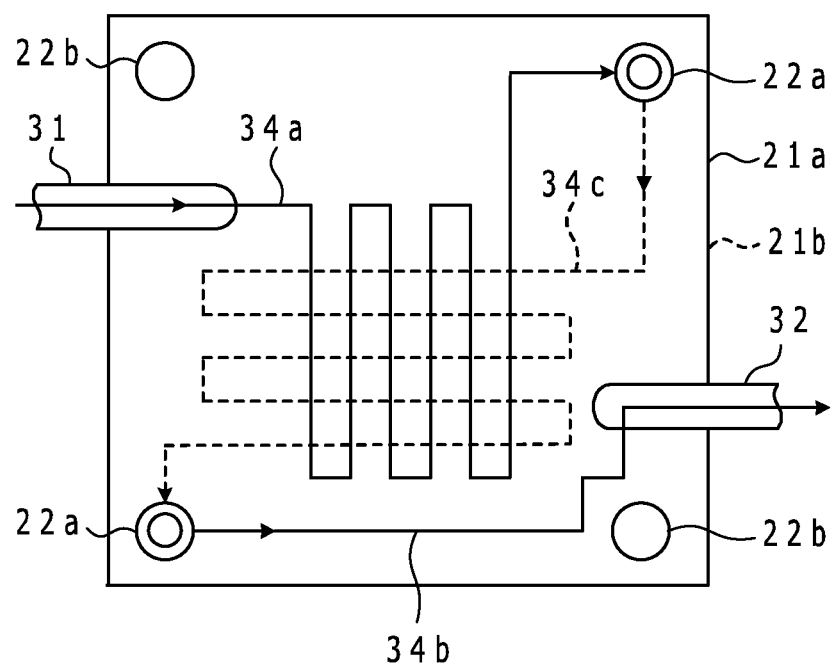
FIG. 5 is a top view illustrating the cooling system.

FIG. 3 is a schematic cross-sectional view illustrating a board assembly including a cooling system according to an embodiment and FIG. 4 is a partial schematic cross-sectional view illustrating the board assembly in FIG. 3. FIG. 5 is a top view illustrating the cooling system.

As illustrated in FIG. 3, a sub board 12a on which a heat generating component 11a is mounted is disposed on a front surface (upper surface) of a wiring board 10. A heat receiving portion 21a is disposed on the heat generating component 11a with a heat conducting sheet (not illustrated) being disposed therebetween. The surface of the heat receiving portion 21a has a flat surface at least at a position facing the heat generating component 11a. As indicated by solid lines in FIG. 5, the heat receiving portion 21a has two channels for a coolant (first channel 34a and second channel 34b) therein.

The heat receiving portion 21a is supported by four support posts (two support posts 22a and two support posts 22b). The heat receiving portion 21a has four through holes through which upper portions of the support posts 22a and 22b pass. The support posts 22a and 22b are described in detail later.

A plurality of sockets 16 is disposed on the front surface of the wiring board 10. Memory board 17 are detachably attached to the sockets 16.

Heat generating components 11b and 11c mounted on sub boards 12b and 12c respectively are disposed on the rear surface (lower surface) of the wiring board 10. In the embodiment illustrated in FIG. 3, the electronic components 18 that generate small amounts of heat are disposed on the rear surface of the wiring board 10.

A heat receiving portion 21b is disposed below the heat generating components 11b and 11c and shared by the heat generating components 11b and 11c. The heat receiving portion 21b has a flat surface at least at a position facing the heat generating components 11b and 11c. As indicated by a broken line in FIG. 5, the heat receiving portion 21b has a channel for coolant (a third channel 34c). A heat conducting sheet (not illustrated) is disposed between each of the heat generating components 11b and 11c and the heat receiving portion 21b.

The wiring board 10 has through holes through which the support posts 22a and 22b pass at predetermined positions. As illustrated in FIG. 4, each support post 22a is a cylindrical pipe that has a channel (space) 26 through which the coolant flows in the axial direction. Each support post 22b is a round bar having an outline substantially identical to that of the support post 22a and does not have a channel for the coolant.

The support posts 22a and 22b are bonded to the heat receiving portion 21b at the bottom ends thereof. The support posts 22a and 22b each have a large diameter portion that has a larger diameter than remaining portions thereof at a position near the bottom end. The large diameter portion is referred to as a spacer 25 hereinafter. A distance between the heat receiving portion 21b and the wiring board 10 is maintained at a predetermined distance by the spacer 25 having an upper end that is in contact with the lower surface of the wiring board 10.

The support posts 22a and 22b each have a threaded peripheral portion at a position slightly above the spacer 25. A fixation screw 23 is screwed on the threaded peripheral portion of each support post 22a and 22b to sandwich the wiring board 10 between the spacer 25 and the fixation screw 23. This enables the support posts 22a and 22b to be secured to the wiring board 10.

A spacer 27 having a hollow cylindrical shape is disposed above the fixation screw 23 of each of the support posts 22a and 22b. The upper portions of the support posts 22a and 22b pass through the through holes in the heat receiving portion 21a as described above.

The support posts 22a and 22b each have another threaded peripheral portion at a position near an upper end thereof. A cap 24 is screwed on the threaded peripheral portion to sandwich the heat receiving portion 21a between the spacer 27 and the cap 24.

The cap 24 includes a water stop packing 24a tightly attached to the upper end of the support post 22a. In addition, an O-ring as a water stop packing 28 is disposed between the spacer 27 and the heat receiving portion 21a and between the heat receiving portion 21a and the cap 24. The water stop packings 24a and 28 reduce leakage between the support post 22a and the cap 24 and between the support post 22a and the heat receiving portion 21a.

The heat conducting sheets disposed between the heat generating component 11a and the heat receiving portion 21a and between each of the heat generating components 11b and 11c and the heat receiving portion 21b are flexible. Thus, no space is provided between the heat generating component 11a and the heat receiving portion 21a and between each of the heat generating components 11b and 11c and the heat receiving portion 21b even if the surfaces of the heat generating components 11a, 11b, and 11c are slightly curved. With this configuration, good thermal conductivity between the heat generating component 11a and the heat receiving portion 21a and between each of the heat generating components 11b and 11c and the heat receiving portion 21b is maintained.

As described above, the support post 22a has the channel 26 through which the coolant flows in the axial direction (see FIG. 4). The channel 26 is in communication with the channel in the heat receiving portion 21b at the lower end of the support post 22a. The support post 22a has a hole at an upper peripheral portion thereof such that the channel 26 of the support post 22a is in communication with a channel in the heat receiving portion 21a through the hole.

As indicated by a solid line in FIG. 5, the first channel 34a is a channel connecting one of the through holes, through which the support posts 22a pass, and a coolant inlet 31 in the heat receiving portion 21a. The first channel 34a extends in a zigzag shape to allow the coolant to zigzag in the heat receiving portion 21a. The second channel 34b connects the other of the through holes, through which the support posts 22a pass, and a coolant outlet 32 in the heat receiving portion 21a.

As indicated by a broken line in FIG. 5, the third channel 34c in the heat receiving portion 21b has ends connected to the lower ends of the support posts 22a. The third channel 34c extends in a zigzag shape to allow the coolant to zigzag in the heat receiving portion 21b.

Figure 6:
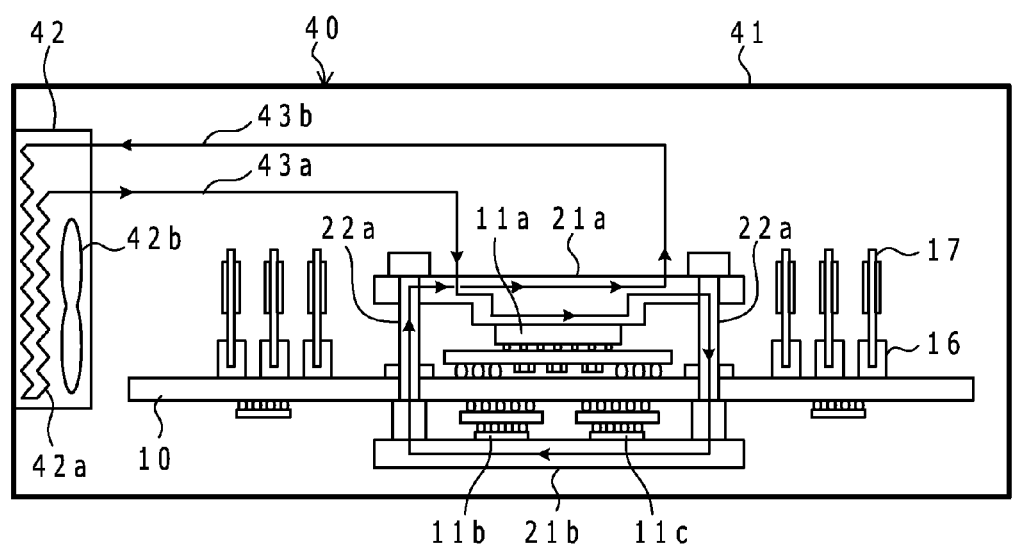
FIG. 6 is a schematic view illustrating an example of an electronic apparatus provided with the board assembly including the cooling system according to the embodiment.

FIG. 6 is a schematic view illustrating an example of an electronic apparatus provided with the board assembly including the cooling system according to the embodiment.

As illustrated in FIG. 6, an electronic apparatus 40 includes a chassis 41, the wiring board 10, and a heat dissipater 42. The wiring board 10 and the heat dissipater 42 are disposed in the chassis 41.

As illustrated in FIG. 3, the heat receiving portions 21a and 21b and the support posts 22a and 22b, for example, are mounted to the wiring board 10. The heat dissipater 42 includes a heat exchanger 42a and a fan 42b.

The coolant supplied from the heat dissipater 42 flows through a pipe 43a and enters the heat receiving portion 21a through the coolant inlet 31 (see FIG. 5). The coolant cools the heat generating component 11a while flowing through the first channel 34a in the heat receiving portion 21a.

The coolant that has passed through the first channel 34a flows through one of the support posts 22a to enter the heat receiving portion 21b. The coolant cools the heat generating components 11b and 11c while flowing through the third channel 34c (see FIG. 5).

The coolant that has passed through the third channel 34c flows through the other of the support posts 22a to enter the second channel 34b in the heat receiving portion 21a, and flows through the second channel 34b to be expelled through the coolant outlet 32 (see FIG. 5).

Since the coolant expelled through the coolant outlet 32 has cooled the heat generating components 11a, 11b, and 11c, the temperature thereof is raised. The coolant having a higher temperature returns to the heat dissipater 42 through a pipe 43b. The coolant is cooled by air from the fan 42b while passing through the heat exchanger 42a, and supplied to the heat receiving portion 21a again.

As described above, in the board assembly including the cooling system according to the embodiment, the heat generated at the heat generating components 11a, 11b, and 11c is transferred to the heat dissipater 42 and is dissipated into the atmosphere from the heat dissipater 42. Thus, the heat generating components 11a, 11b, and 11c are maintained within a permissible operating temperature limit.

In the embodiment, two support posts 22a each having the channel 26 extending in the axial direction allow the coolant to flow in the heat receiving portions 21a and 21b. In this configuration, only two pipes have to be provided for the coolant and the total length of the pipes is relatively short even if the heat generating component is mounted on each surface of the wiring board 10. As a result, the assembly including the pipes has a relatively small size, which enables downsizing of the electronic apparatus. In addition, the assembly including the pipes has relatively light weight, which reduces weight of the electronic apparatus.

First Modification

Figure 7:
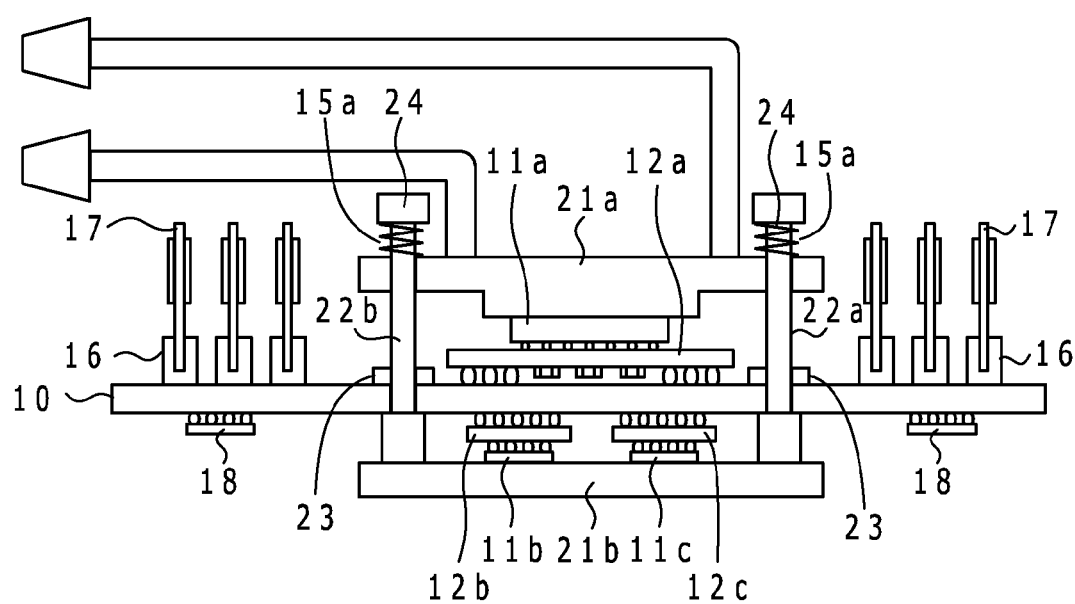
FIG. 7 is a schematic cross-sectional view illustrating a board assembly including a cooling system according to a first modification.
Figure 8:
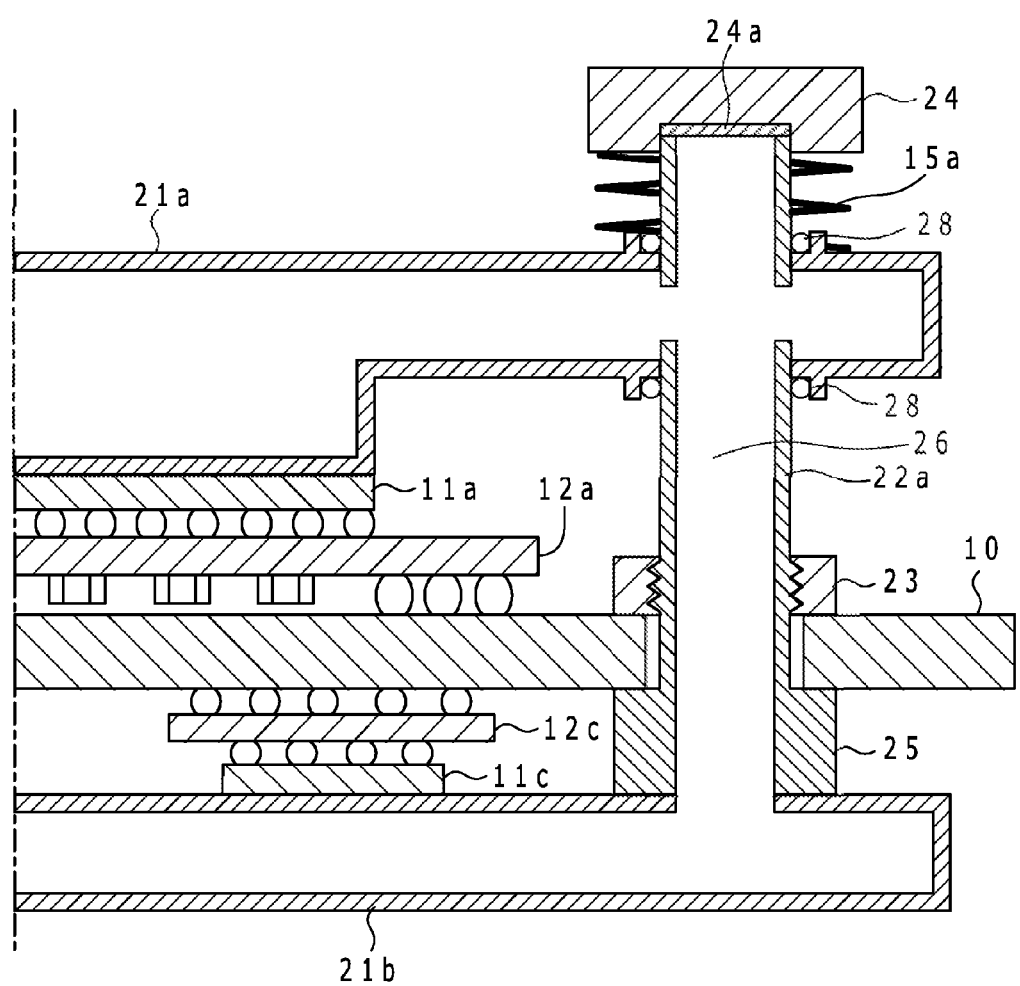
FIG. 8 is a partial schematic cross-sectional view illustrating the board assembly in FIG. 7.

FIG. 7 is a schematic cross-sectional view illustrating a board assembly including a cooling system according to a first modification. FIG. 8 is a partial schematic cross-sectional view illustrating the board assembly in FIG. 7. In FIG. 7 and FIG. 8, components identical to those in FIG. 3 and FIG. 4 are assigned the same reference numerals as those in FIG. 3 and FIG. 4 and are not described in detail.

In the board assembly including the cooling system according to the first modification, a spring 15a is disposed between the cap 24 and the heat receiving portion 21a. The spring 15a compresses the heat receiving portion 21a such that the heat receiving portion 21a and the heat generating component 11a are in close contact with each other at a predetermined pressure. With this configuration, thermal conductivity between the heat generating component 11a and the heat receiving portion 21a is stabilized.

Second Modification

Figure 9:
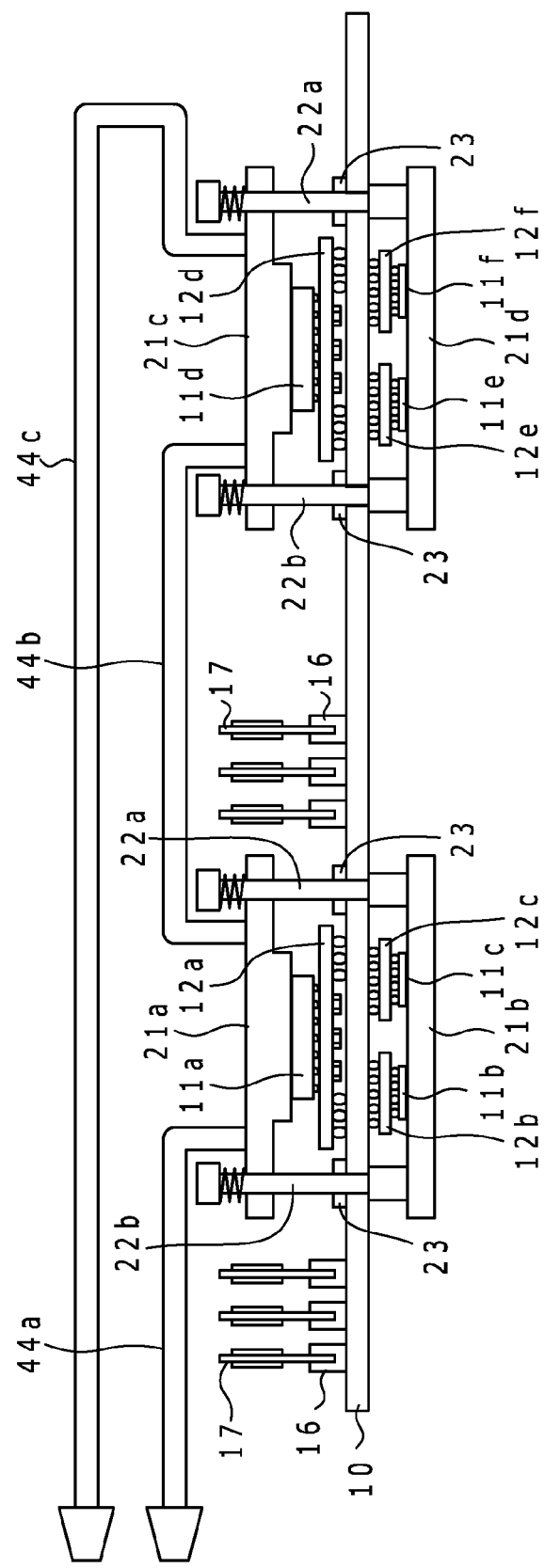
FIG. 9 is a schematic cross-sectional view illustrating a board assembly including a cooling system according to a second modification.
Figure 10:
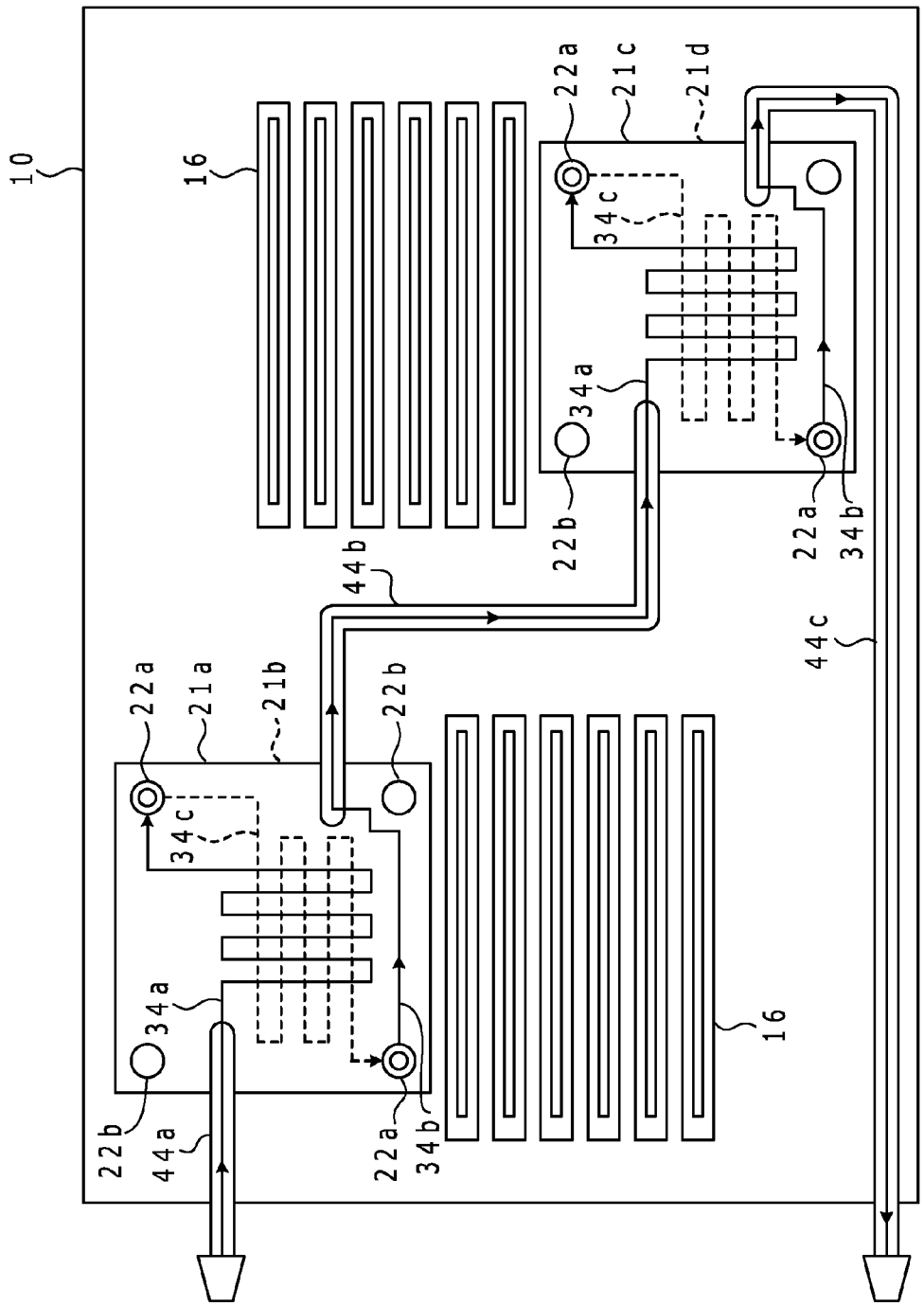
FIG. 10 is a plan view illustrating the board assembly including the cooling system according to the second modification.

FIG. 9 is a schematic cross-sectional view illustrating a board assembly including a cooling system according to a second modification. FIG. 10 is a plan view illustrating the board assembly in FIG. 9. In FIG. 9, components identical to those in FIG. 7 are assigned the same reference numerals as those in FIG. 7 and are not described in detail.

As illustrated in FIG. 9 and FIG. 10, in the board assembly according to the second modification, heat generating components 11a and 11d are mounted on the front surface (upper surface) of the wiring board 10. In addition, heat generating components 11b, 11c, 11e, and 11f are mounted on the rear surface of the wiring board 10.

The heat receiving portions 21a and 21c are disposed on the heat generating components 11a and 11d respectively. The heat receiving portions 21a and 21c have the first and second channels 34a and 34b respectively as illustrated in FIG. 10.

The heat receiving portion 21b is disposed below the heat generating components 11b and 11c, and the heat receiving portion 21d is disposed below the heat generating components 11e and 11f. The heat receiving portions 21b and 21d each have the third channel 34c as illustrated in FIG. 10.

The heat receiving portions 21a and 21b are secured to the wiring board 10 by the support posts 22a and 22b. The first channel 34a in the heat receiving portion 21a is in communication with the inlet of the third channel 34c in the heat receiving portion 21b through the channel 26 in one of the support posts 22a. The outlet of the third channel 34c in the heat receiving portion 21b is in communication with the inlet of the second channel 34b in the heat receiving portion 21a through the channel 26 in the other of the support posts 22a.

The heat receiving portions 21c and 21d are secured to the wiring board 10 by the support posts 22a and 22b in the same manner as the above. The first channel 34a in the heat receiving portion 21c is in communication with the inlet of the third channel 34c in the heat receiving portion 21d through the channel 26 in one of the support posts 22a. The outlet of the third channel 34c in the heat receiving portion 21d is in communication with the inlet of the second channel 34b in the heat receiving portion 21c through the channel 26 in the other of the support posts 22a.

The coolant inlet of the heat generating component 21a is connected to a coolant supply port of the heat dissipater 42 (see FIG. 6) through a pipe 44a. The coolant outlet of the heat generating component 21a is connected to the coolant inlet of the heat generating component 21c through a pipe 44b. The coolant outlet of the heat generating component 21c is connected to the coolant return port of the heat dissipater 42 through a pipe 44c.

In the board assembly including the cooling system according to the second modification, the coolant is supplied from the heat dissipater 42 to the coolant inlet of the heat receiving portion 21a through the pipe 44a. The coolant cools the heat generating component 11a while flowing through the first channel 34a in the heat receiving portion 21a.

The coolant that has passed through the first channel 34a enters the heat receiving portion 21b through one of the support posts 22a. The coolant cools the heat generating components 11b and 11c while flowing through the third channel 34c in the heat receiving portion 21b.

The coolant that has passed through the third channel 34c enters the second channel 34b in the heat receiving portion 21a through the other of the support posts 22a. Then, the coolant flows through the second channel 34b to be expelled through the coolant outlet.

The coolant that has been expelled from the heat receiving portion 21a flows through the pipe 44b to enter the heat receiving portion 21c through the coolant inlet. Then, the coolant cools the heat generating component 11d while flowing through the first channel 34a in the heat receiving portion 21c.

The coolant that has passed through the first channel 34a enters the heat receiving portion 21d through one of the support posts 22a. The coolant cools the heat generating components 11e and 11f while flowing through the third channel 34c in the heat receiving portion 21d.

The coolant that has passed through the third channel 34c enters the second channel 34b in the heat receiving portion 21c through the other of the support posts 22a. Then, the coolant flows through the second channel 34b to be expelled through the coolant outlet.

The coolant that has been expelled from the heat receiving portion 21c returns to the heat dissipater 42 through the pipe 44c. The coolant is cooled by air from the fan 42b while passing through the heat exchanger 42a and is supplied to the heat receiving portion 21a again as the coolant.

Third Modification

Figure 11:
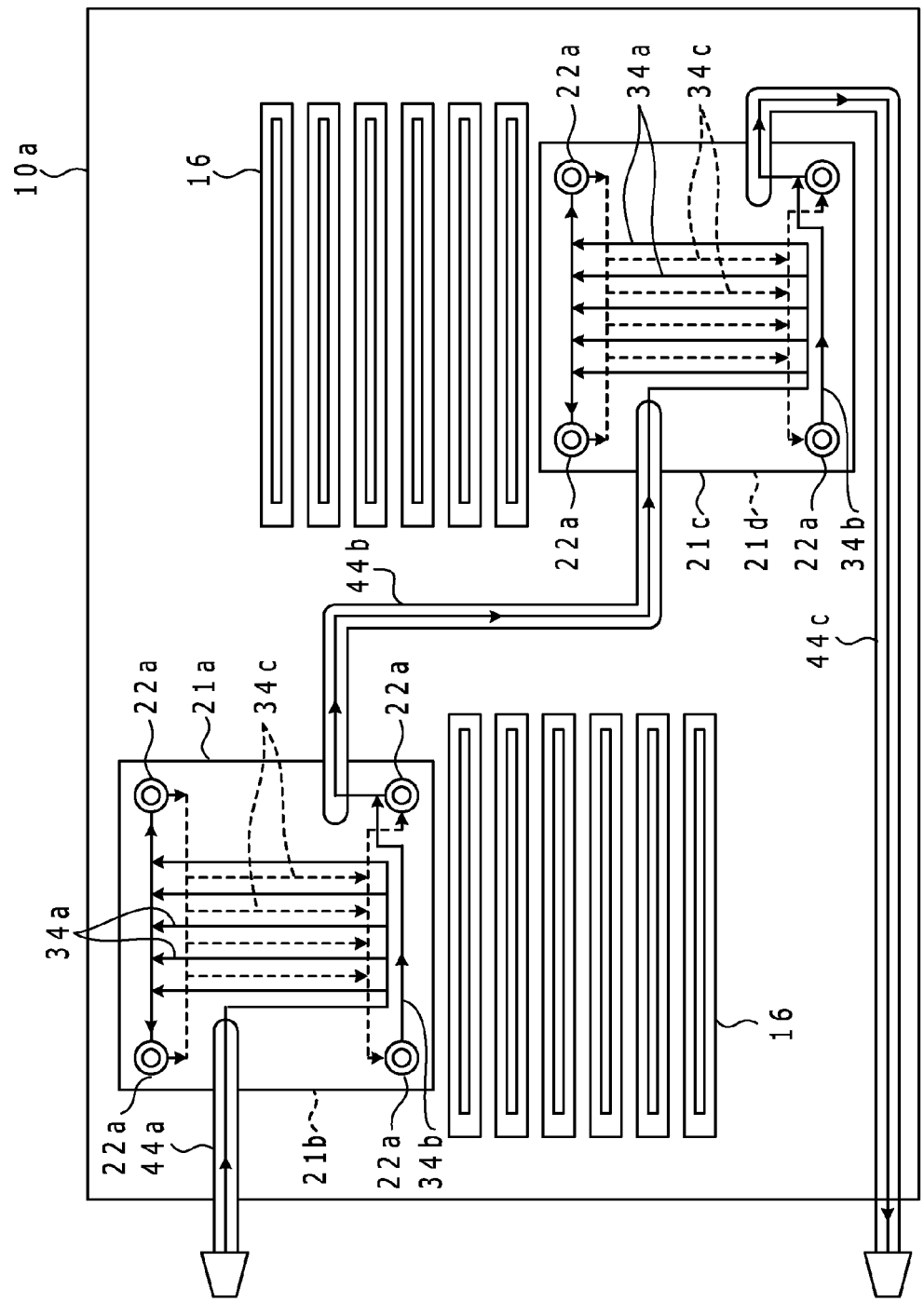
FIG. 11 is a plan view illustrating a board assembly including a cooling system according to a third embodiment.

FIG. 11 is a plan view illustrating a board assembly including a cooling system according to a third modification. The third modification basically has the same configuration as the second modification except for configurations of channels in the heat receiving portions 21a to 21d. In FIG. 11, components identical to those in FIG. 10 are assigned the same reference numerals and are not described in detail.

In the board assembly including the cooling system according to the third modification, the heat receiving portions 21a and 21b are secured to the wiring board 10 by four support posts 22a. As indicated by a solid line in FIG. 11, the heat receiving portion 21a has a plurality of first channels 34a (five first channels 34a in FIG. 11) connected in parallel and positioned to connect the coolant inlet and two of the support posts 22a and the second channel 34b positioned to connect the other two support posts 22a and the coolant outlet.

As indicated by a broken line in FIG. 11, the heat receiving portion 21b also has a plurality of the third channels 34c (four third channels 34c in FIG. 11) connected in parallel and positioned to connect two of the support posts 22a and the other two support posts 22a.

The heat receiving portions 21c and 21d are also secured to the wiring board 10 by four support posts 22a as the heat receiving portion 21b. As indicated by a solid line in FIG. 11, the heat receiving portion 21c has a plurality of first channels 34a (five first channels 34a in FIG. 11) connected in parallel and positioned to connect the coolant inlet and two of the support posts 22a and the second channel 34b positioned to connect the other two support posts 22a and the coolant outlet.

The heat receiving portion 21d also has a plurality of third channels 34c (four third channels 34c in FIG. 11) connected in parallel and positioned to connect two of the support posts 22a and the other two support posts 22a.

As described above, in the third modification, the heat receiving portions 21a to 21d each have the channels connected in parallel. This configuration enables a large amount of the coolant to flow through the heat receiving portions 21a to 21d compared with the second modification, and thus the heat generating components 11a to 11f are significantly cooled.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A board assembly including a cooling system comprising:
   a wiring board;
   a first heat generating component mounted on a surface of the wiring board;
   a first heat receiving portion mounted on the first heat generating component and configured to allow a coolant to pass therethrough;
   a second heat generating component mounted on another surface of the wiring board;
   a second heat receiving portion mounted on the second heat generating component and configured to allow the coolant to pass therethrough; and
   a support post disposed through the wiring board so as to extend between the first heat receiving portion and the second heat receiving portion, the support post having a space through which the coolant flows from the first heat receiving portion to the second heat receiving portion or from the second heat receiving portion to the first heat receiving portion,
   wherein the support post extends through the first heat receiving portion,
   wherein the support post defines, along a longitudinal direction, a hole at an upper peripheral side portion thereof, and
   wherein the space of the support post is in fluid communication with a first channel in the first heat receiving portion via the hole.

2. The board assembly including the cooling system according to claim 1, wherein the support post includes: a spacer having a larger diameter than remaining portions of the support post; a threaded peripheral portion positioned away from the spacer; and a fixation screw screwed on the threaded peripheral portion such that the wiring board is sandwiched between the fixation screw and the spacer.

3. The board assembly including the cooling system according to claim 1, wherein the support post includes a plurality of support posts including a first support post and a second support post,
   the first heat receiving portion has a coolant inlet, a coolant outlet, and a second channel through which the coolant flows,
   the second heat receiving portion has a third channel through which the coolant flows,
   the first channel extends between the coolant inlet and the first support post so as to allow communication therebetween,
   the third channel allows the space in the first support post to be in communication with the space in the second support post, and
   the second channel allows the second support post to be in communication with the coolant outlet.

4. The board assembly including the cooling system according to claim 3, wherein at least one of the support posts has a hole at an upper portion thereof, and the space in the support post is in communication with the second channel through the hole.

5. The board assembly including the cooling system according to claim 1, wherein the support post is secured to the second heat receiving portion, and the space in the support post is in communication with the third channel at a lower portion of the support post.

6. The board assembly including the cooling system according to claim 1, wherein the first heat receiving portion and the second heat receiving portion each have a plurality of channels connected in parallel.

7. The board assembly including the cooling system according to claim 1, wherein the support post includes four support posts.

8. An electronic apparatus comprising:
   a chassis; and
   a board assembly including a cooling system disposed in the chassis, the board assembly including the cooling system comprising
   a wiring board,
   a first heat generating component mounted on a surface of the wiring board,
   a first heat receiving portion mounted on the first heat generating component and configured to allow a coolant to pass therethrough,
   a second heat generating component mounted on another surface of the wiring board,
   a second heat receiving portion mounted on the second heat generating component and configured to allow the coolant to pass therethrough, and
   a support post disposed through the wiring board so as to extend between the first heat receiving portion and the second heat receiving portion, the support post having a space through which the coolant flows from the first heat receiving portion to the second heat receiving portion or from the second heat receiving portion to the first heat receiving portion,
   wherein the support post extends through the first heat receiving portion,
   wherein the support post defines, along a longitudinal direction, a hole at an upper peripheral side portion thereof, and
   wherein the space of the support post is in fluid communication with a first channel in the first heat receiving portion via the hole.

9. The electronic apparatus according to claim 8, wherein the chassis further comprising a heat dissipater configured to cool the coolant expelled from the first heat receiving portion and supply the coolant to the first heat receiving portion.

* * * * *